(12) United States Patent
Hofer et al.

(10) Patent No.: US 12,208,704 B2
(45) Date of Patent: Jan. 28, 2025

(54) MONITORING DEVICE FOR A BATTERY MODULE, BATTERY SYSTEM AND METHOD FOR BATTERY SYSTEM

(71) Applicants: Infineon Technologies AG, Neubiberg (DE); Volkswagen Aktiengesellschaft, Wolfsburg (DE)

(72) Inventors: Guenter Hofer, St. Oswald (AT); Marko Cehovski, Lehrte (DE)

(73) Assignees: Infineon Technologies AG, Neubiberg (DE); Volkswagen Aktiengellschaft, Wolfsburg (DE)

( * ) Notice: Subject to any disclaimer, the term of this patent is extended or adjusted under 35 U.S.C. 154(b) by 304 days.

(21) Appl. No.: 17/658,069

(22) Filed: Apr. 5, 2022

(65) Prior Publication Data

US 2022/0348110 A1 Nov. 3, 2022

(30) Foreign Application Priority Data

Apr. 28, 2021 (DE) .......................... 102021110891.8

(51) Int. Cl.
*B60L 58/24* (2019.01)
*G01R 31/374* (2019.01)
*G01R 31/396* (2019.01)
*H01M 50/204* (2021.01)

(52) U.S. Cl.
CPC .......... *B60L 58/24* (2019.02); *G01R 31/374* (2019.01); *G01R 31/396* (2019.01); *H01M 50/204* (2021.01); *H01M 2220/20* (2013.01)

(58) Field of Classification Search
None
See application file for complete search history.

(56) References Cited

U.S. PATENT DOCUMENTS

| 5,652,498 | A | * | 7/1997 | Edye | G01R 31/396 320/DIG. 21 |
| 6,020,717 | A | * | 2/2000 | Kadouchi | G01R 31/3835 320/136 |
| 7,079,038 | B2 | | 7/2006 | Wendelrup et al. | |
| 7,911,178 | B2 | * | 3/2011 | Kawata | B60L 58/20 320/116 |
| 10,298,028 | B1 | * | 5/2019 | Venkatasamy | H02J 7/00 |
| 10,467,890 | B2 | * | 11/2019 | Lunardhi | G08B 29/16 |

(Continued)

FOREIGN PATENT DOCUMENTS

| CN | 104635167 A | * | 5/2015 |
| CN | 107599849 A | * | 1/2018 |

(Continued)

OTHER PUBLICATIONS

Omega, Working principle of thermocouples (Year: 2020).*

(Continued)

*Primary Examiner* — Redhwan K Mawari
*Assistant Examiner* — Kai Wang
(74) *Attorney, Agent, or Firm* — Shumaker & Sieffert, P.A.

(57) ABSTRACT

Monitoring devices for battery systems, battery systems and corresponding methods are provided. A monitoring device can communicate via a first interface with a control device. The monitoring device can communicate with a security device via a second interface in a first operating mode, and can communicate with a temperature sensor in a second operating mode of the second interface.

11 Claims, 6 Drawing Sheets

(56) References Cited

U.S. PATENT DOCUMENTS

| | | | |
|---|---|---|---|
| 10,707,473 B2 | 7/2020 | Hellenthal et al. | |
| 2008/0299819 A1* | 12/2008 | Kakutani | B41J 29/393 |
| | | | 439/489 |
| 2009/0155673 A1* | 6/2009 | Northcott | B60L 58/22 |
| | | | 429/61 |
| 2011/0140669 A1* | 6/2011 | Murakami | H02J 7/00308 |
| | | | 320/134 |
| 2012/0049785 A1* | 3/2012 | Tanaka | B60L 53/305 |
| | | | 320/106 |
| 2017/0149873 A1* | 5/2017 | Jang | H04L 67/1095 |
| 2017/0300439 A1* | 10/2017 | Paryani | B60L 3/0092 |
| 2019/0219638 A1* | 7/2019 | Witcraft | G01L 23/085 |
| 2020/0293081 A1* | 9/2020 | Amarilio | G06F 13/24 |

FOREIGN PATENT DOCUMENTS

| | | |
|---|---|---|
| DE | 19750958 C2 | 9/2000 |
| DE | 102009025801 A1 | 11/2010 |
| DE | 102012021847 A1 | 5/2014 |
| DE | 102015208106 A1 | 11/2016 |
| EP | 1145402 B1 | 4/2009 |
| EP | 3259793 B1 | 11/2019 |
| WO | WO-2018078298 A1 * | 5/2018 |
| WO | WO-2020125407 A1 * | 6/2020 |

OTHER PUBLICATIONS

Omega, Working principle of thermocouples, https://www.omega.com/en-us/resources/how-thermocouples-work (Year: 2020).*

* cited by examiner

MONITORING DEVICE FOR A BATTERY MODULE, BATTERY SYSTEM AND METHOD FOR BATTERY SYSTEM

This Application claims priority to German Application Number 102021110891.8, filed on Apr. 28, 2021, the entire content of which is incorporated herein by reference.

TECHNICAL FIELD

The present application relates to monitoring devices for battery modules, battery systems and corresponding methods.

BACKGROUND

Battery systems, for electric vehicles, for example, normally have a multiplicity of battery modules which are also individually exchangeable. Battery modules can have different quality levels, for example in terms of their durability, precision of the output voltage, stability with respect to environmental influences, etc.

For warranty reasons, for example, manufacturers of battery systems or electric vehicles containing battery systems of this type do not want battery modules to be exchanged for lower-quality battery modules. An electric vehicle can, for example, drive with battery modules of this type, but problems may nevertheless occur due to the lower quality. One option here is to provide security devices on the battery modules which can then be interrogated by a battery management system. Not only wireless options for security devices of this type, such as passive RFID devices, are possible, but also wired solutions which communicate via a bus such as the I2C bus or via a single-wire bus.

Security devices of this type are then also fitted in the battery module so that the security device cannot be removed from the battery module without losing its function. The security device can, for example, be destroyed or switched to an inoperable state if the battery module is opened. In this way, the security devices are prevented from being used in a different, for example lower-quality, battery module.

When the vehicle or a different device which uses the battery system is started, the security devices of the battery modules are then interrogated. The battery module is activated (for example by closing a main relay) only if it is established that all battery modules are provided with a correct security devices, and the vehicle can start, or a different device can be used.

In an automobile environment, wired solutions can be more robust than wireless solutions in terms of interfering influences. On the other hand, costs are an important factor, so that the implementation expenditure in terms of necessary wiring or additional hardware should be as low as possible.

SUMMARY

A monitoring device according to claim 1 and a method according to claim 9 are provided. The subclaims define further embodiments of the monitoring device and the method, and also a battery system having a monitoring device of this type.

According to one example embodiment, a monitoring device for a battery module is provided, having:
a first interface which is configured to communicate with a control device, and
a second interface which is configured to communicate as a digital interface with a security devices of the battery module in a first operating mode, and to communicate with a temperature sensor in a second operating mode, wherein the first operating mode and the second operating mode at least partially use the same connections of the second interface.

According to a different example embodiment, a method for a battery system is provided, comprising:
communicating between a monitoring device and a control device via a first interface of the monitoring device,
communicating between the monitoring device and a security devices of a battery module via a second interface of the monitoring device in a first operating mode of the first interface as a digital interface, and
communicating between the monitoring device and a temperature sensor via the second interface in a second operating mode of the second interface, wherein the first operating mode and the second operating mode at least partially use the same connections of the second interface.

The summary above serves merely to provide a brief overview of some example embodiments and is not to be interpreted as limiting, since other embodiments can have features other than the features defined above.

DETAILED DESCRIPTION

Different example embodiments are explained in detail below. These example embodiments serve merely as illustrations and are not to be interpreted as limiting. Example embodiments having a multiplicity of features (components, elements, circuit parts, method steps, procedures, etc.) are thus described. In other example embodiments, some of these features can be omitted or replaced with alternative feature. In addition to the features described, further features, for example in conventional battery systems and security devices, can also be provided.

Example embodiments described below thus relate to communication between a monitoring device and a security device, a temperature sensor and a control device. Apart from this communication, the monitoring device, the security device, the control device and the entire battery system can be designed in a conventional manner, and conventional parts and components of this type are not explained in detail.

Features of different example embodiments can be combined with one another. Variations and modifications which are described for one of the example embodiments are also applicable to other example embodiments unless otherwise indicated, and are not therefore described repeatedly.

In different example embodiments, a monitoring device communicates via a first interface with a control device, and via a second interface with either a temperature sensor or a security devices. The term "communicate" is to be understood generally to mean the transmission and reception of signals, currents, voltages and the like. Communication with a temperature sensor, for example, can also mean that a current is applied to the temperature sensor, for example a temperature-dependent resistor, and a resulting voltage is measured. A readout of the temperature sensor of this type is also to be understood as communication.

Figure 1:
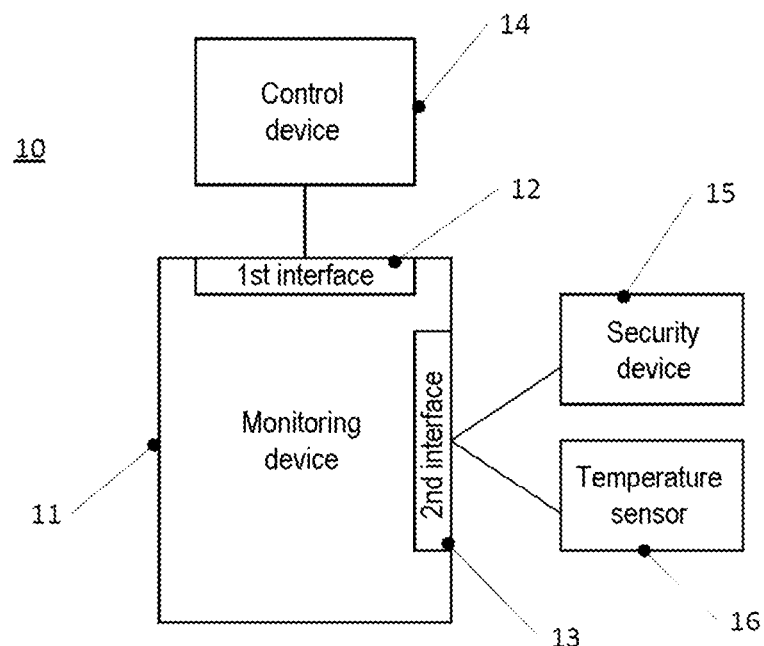
FIG. 1 is a block diagram of a system according to one example embodiment.

FIG. 1 shows a block diagram of a system 10 according to one example embodiment. The system 10 has a monitoring device 11 which is assigned to a battery module of a battery system.

The monitoring device 11 communicates via a first interface 12 with a control device 14. The controller 14 can, for example, be a battery management controller. The first interface 12 can be any interface conventionally used in automobile systems, particularly in battery management systems. Examples of this are interfaces with galvanic decoupling such as ISO-CAN, ISO UART or ISO SPI.

In a normal operation, the monitoring device 11 monitors different parameters of an assigned battery module, such as, for example, voltage or temperature. A temperature sensor 16 with which the monitoring device 11 communicates via a second interface 13 is shown as an example in FIG. 1. In some example embodiments, the temperature sensor 16 can be a group of temperature-dependent resistors, i.e. one or more temperature-dependent resistors, for example NTC (negative temperature coefficient) resistors. In this case, communication via the second interface means that the monitoring device 11 applies a current to the temperature-dependent resistors and voltage drops resulting from the current are measured via the resistors, representing a measure of the temperature of the battery module. The temperature measured in this way can be communicated via the first interface 12 to the control device 14.

If, for example, the measured temperature indicates an overtemperature, a battery main switch can be opened in order to disconnect the battery system from the power supply system, a warning can be output or other measures can be instigated. The same applies to the monitoring of other parameters, such as, for example, the voltage of the battery module. Here, for example, if the voltage falls below a lower voltage limit value, the control device 14 can cause a warning to be output to a driver of a vehicle correspondingly configured with the battery system, and/or the battery main switch can be opened.

The communication described thus far can correspond to the communication and operation in conventional systems. This operating mode is referred to below as the second operating mode.

Unlike conventional monitoring devices, the monitoring device 11 can additionally communicate via the second interface 13 with a security device 15 assigned to the respective battery module. The second interface can be operated as a digital interface, for example an I2C interface, for this purpose. This operating mode is referred to below as the first operating mode. The security device 15 can similarly be implemented in a conventional manner and can, for example, store a specific code or can respond in a specific manner to a specific inquiry-response routine so that it can be established whether the battery module to which the security devices 15 is assigned corresponds to a type intended for the respective battery system.

In the monitoring device 11, the second interface is therefore used not only for communicating with a temperature sensor in the second operating mode, but also as a digital interface for communicating with the security device 15 in the first operating mode. At least some connections of the second interface are used in both the first and the second operating mode. In other words, the second interface is not simply a "juxtaposition" of two secondary interfaces, but at least the same connections are actually used in both operating modes. "At least partially" means here, for example, that only some of the connections of the second interface are used in one operating mode, and all connections are used in the other operating mode, or that, for one operating mode, a further additional connection exists, if necessary, specifically for this operating mode, whereas other connections are used jointly. Examples of this will be explained later.

As will be explained in further detail later, when, for example, a system which uses the battery module is started, the control device 14 can then read the security device 15 via the monitoring device 11, i.e. the control device 14 transmits corresponding signals to the monitoring device 11 so that the latter reads the security device 15 and transmits the result to the control device 14. If the battery module is authenticated in this manner, the device, for example a motor vehicle, can be started. In subsequent operation, the second interface then operates in the second operating mode so that the monitoring device 11 monitors the temperature of the battery module by means of the temperature sensor 16.

Figure 2:
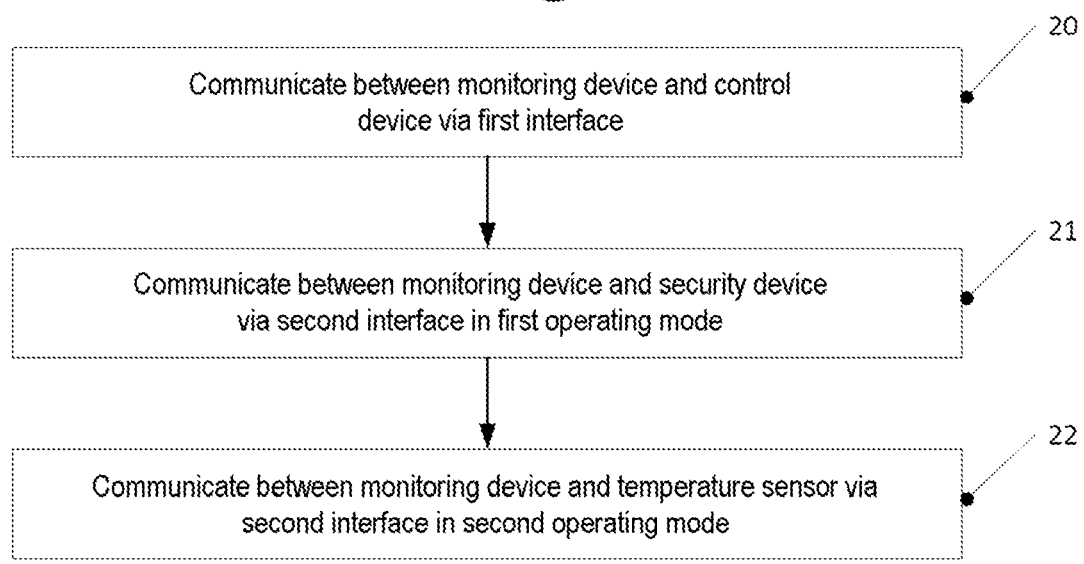
FIG. 2 is a flow diagram to illustrate a method according to one example embodiment.

FIG. 2 shows a flow diagram of a method according to one example embodiment. The method shown in FIG. 2 can be implemented in the system 10 shown in FIG. 1, or can also be implemented in other systems as explained below. To avoid repetitions, FIG. 2 is described with reference to the above explanations relating to FIG. 1.

Although the method shown in FIG. 2 is described as a sequence, the order shown is not to be interpreted as limiting. The procedures illustrated can also be carried out in a different order, repeatedly, or at least partially, i.e. in some of the procedures as explained below on the basis of examples, and also simultaneously.

At 20, a monitoring device such as the monitoring device 11 shown in FIG. 1, communicates with a control device such as the control device 14 via a first interface such as the first interface 12.

At 21, the monitoring device communicates in a first operating mode, for example when a system is started, with a security device such as the security device 15 via a second interface in a first operating mode of the second interface, in particular as a digital interface. The communication at 20 and the communication at 21 can be carried out in such a way that the control device ultimately communicates via the monitoring device with the security devices and thus identifies the battery module. This is an example showing that the communication at 20 and the communication at 21 can be carried out simultaneously or can be interwoven.

At 22, for example in a normal operating mode following the start in the event of successful authentication, the monitoring device communicates with a temperature sensor such as the temperature sensor 16 via the second interface in a second operating mode. Thus, for example, a temperature of the battery module can then be monitored in the second operating mode. This can also take place simultaneously with the communication at 20 in order to transmit the measured temperature to the control device.

Figure 3:
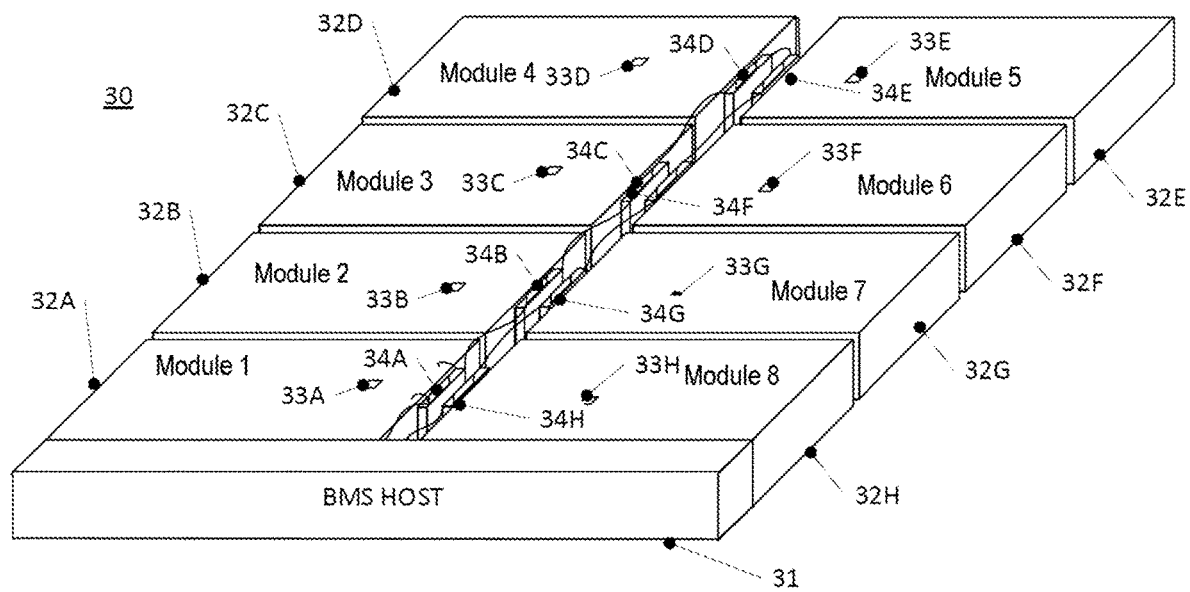
FIG. 3 shows a schematic view of a battery system according to one example embodiment.

The concepts discussed with reference to FIGS. 1 and 2 will now be explained in further detail on the basis of specific example embodiments. In this respect, FIG. 3 shows a battery system 30 according to one example embodiment. The battery system shown in FIG. 3 has a battery management system host 31 and eight battery modules 32A to 32H, referred to collectively as battery modules 32, as the control device. The number of eight battery modules 32 is merely an example, and a different number of battery modules can also be provided. Each of the battery modules 32 has a respective security device 33A to 33H, referred to collectively as security devices 33, and monitoring devices 34A to 34H, referred to collectively as monitoring devices 34.

The monitoring devices 34 can be designed as described with reference to FIG. 1 or as explained in detail below. The monitoring devices 34 are connected to the battery management system host 31 via lines as shown similar to a daisy-chain configuration, and further communicate with measuring devices of the respective battery module, for example temperature sensors, voltage sensors or the like. The communication with temperature sensors takes place as explained above in a second operating mode, while the monitoring devices 34 can further communicate with the respective security devices 33 in a first operating mode. In this way, when a device, for example a motor vehicle, containing the battery system 30 is started, the battery management system host 31 can interrogate the security devices 33 via the monitoring devices 34 and can enable the use of the battery system 30 only in the event of successful authentication, i.e., for example, if correct types of battery modules are present. The temperature of the battery modules 32 and other parameters such as battery voltages can then be monitored during normal operation in a second operating mode.

The monitoring devices 34 can be connected via a plug-in connectors to the respective battery modules. One example of this is shown schematically in FIG. 4.

Figure 4:
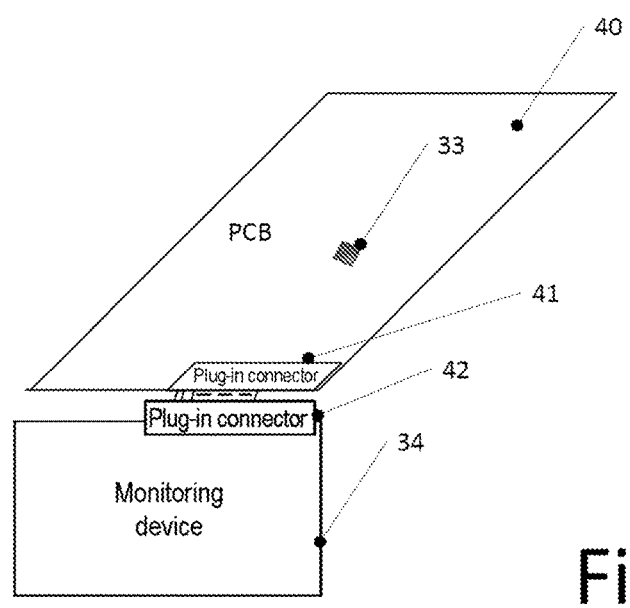
FIG. 4 shows an example of a connection between a monitoring device and a battery module according to one example embodiment.

In the example shown in FIG. 4, the respective battery module 32 (not explicitly shown in FIG. 4) has, for example, a printed circuit board (PCB) 40 on one side. This merely represents one example, and a PCB directly on the battery module or a flex print PCB can also be used. In another example embodiments, only individual cable connections of components such as temperature sensors can also run to the plug-in connectors 41 described below without a PCB being provided. The respective safety device 33 can be disposed along with other components on this printed circuit board 40.

The printed circuit board 40 has the aforementioned plug-in connector 41 which is connected to a plug-in connector 42 of the monitoring device in order to thus establish an electrical connection between the monitoring device 34 and the printed circuit board 40. Further components such as temperature sensors, voltage sensors and the like which are thermally coupled (in the case of temperature sensors) or electrically coupled (in the case of voltage sensors) to the actual battery cells can also be provided along with the safety device 33 on the printed circuit board 40.

Figure 5:
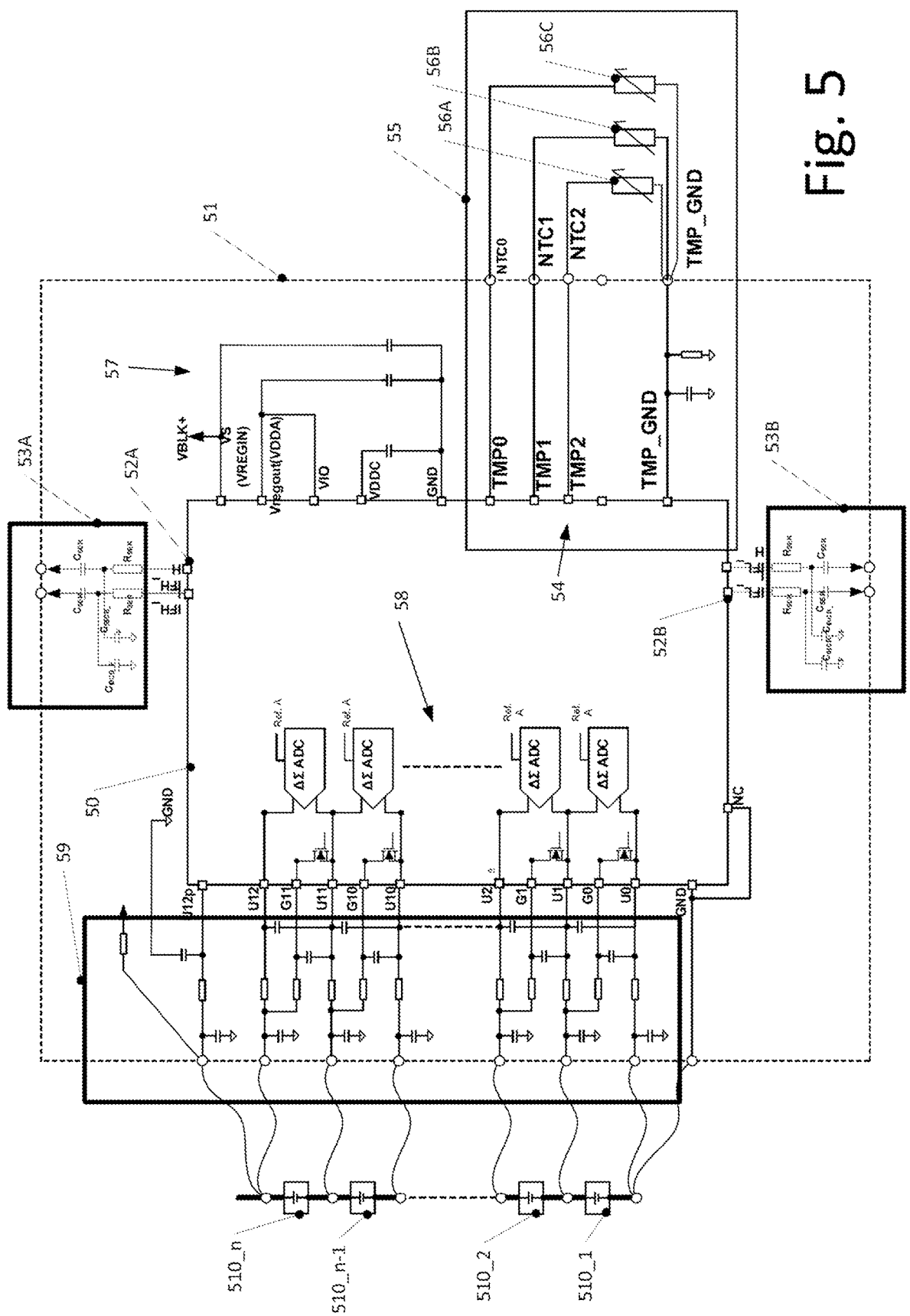
FIG. 5 shows a circuit diagram of a monitoring device according to one example embodiment with additional elements.

FIG. 5 shows a monitoring device 50 according to a further example embodiment. In the example shown in FIG. 5, the monitoring device 50 is disposed on its own printed circuit board 51 which can differ from the printed circuit board 40 shown in FIG. 4 and is disposed on the external wiring of the monitoring device 50. The monitoring device 50 itself can be an integrated circuit or can comprise a plurality of raw chips (dies) integrated into a package.

The monitoring device 50 serves to monitor a battery module which can have a plurality of battery cells 510_1 to 510_n, where n≥1, in many cases n>2, e.g. n=3.

As the first interface, the monitoring device 50 has an interface pair 52A, 52B in each case having external circuitry 53A, 53B on the printed circuit board 51. A plurality of monitoring devices can communicate in a daisy-chain-like configuration, i.e. connected in series, as shown in FIG. 3, with a control device such as the battery management system host 31 by means of the interfaces 52A, 52B. The illustrated implementation and external circuitry of the interfaces are to be understood only as an example, and any suitable interface can be used. A direct connection of each monitoring device to the control device can also be provided instead of a daisy-chain-like configuration.

The monitoring device 50 further has a second interface with connections TMP0, TMP1, TMP2 and TMP_GND, the latter as a ground connection. More connections TMPx of this type, e.g. six connections, or fewer connections of this type can also be provided. The second operating mode is shown in FIG. 5 in which the second interface 54 is connected via corresponding connections NTC0, NTC1, NTC2 and TMP_GND of the printed circuit board 51 to temperature-dependent resistors 56A to 56C, in the example resistors with negative temperature coefficients (NTC). A block 55 shows as a whole a section of the system from FIG. 5 used for the temperature measurement. In the example shown in FIG. 5, three temperature-dependent resistors 56A to 56C are shown which, for example, can provide a redundancy or can be disposed at different locations on the assigned battery module 32 in order to measure the temperature at different locations. More or fewer than three resistors can also be provided, or different temperature sensors can be used.

For the temperature measurement, the monitoring device 50 applies a measurement current to the resistors 56A to 56C in the second operating mode and measures a corresponding voltage drop, for example with analog-to-digital converters (not shown). The temperature determined in this way can then be communicated via the first interfaces 52A, 52B to a control device such as the battery management host 31.

A first operating mode in which the interface 54 is used to communicate with a safety device will be explained later with reference to FIGS. 6A to 6C.

The monitoring device 50 further has analog-to-digital converters 58 by means of which voltages (U) of the battery cells 510_1 to 510_n are measured via a filter network 59 which is used for filtering and ensuring electromagnetic compatibility. Connections denoted G can be used for balancing the cells via which MOSFETs, for example, can be controlled. In some example embodiments, a diagnosis with open load can also be carried out. These measurements and/or the balancing can be performed in a conventional manner and will not therefore be explained in detail. Different voltages can further be generated in a section 57 and can be fed to the monitoring device 50. This can similarly be performed in a conventional manner.

The monitoring device 50 can thus monitor electrical quantities in normal operation (via the analog-to-digital converter arrangement 58) and the temperature (via the block 55) of the battery module. This is to be understood merely as an example, and other quantities, such as, for example, humidity, can also be monitored. As already mentioned above, the present application relates mainly to techniques by means of which, with an interface, in the case of FIG. 5 the second interface 54, a temperature measurement is performed in one operating mode and a communication with a security device takes place in another operating mode, and other parts of monitoring devices can be implemented in a conventional manner.

Figure 6A:
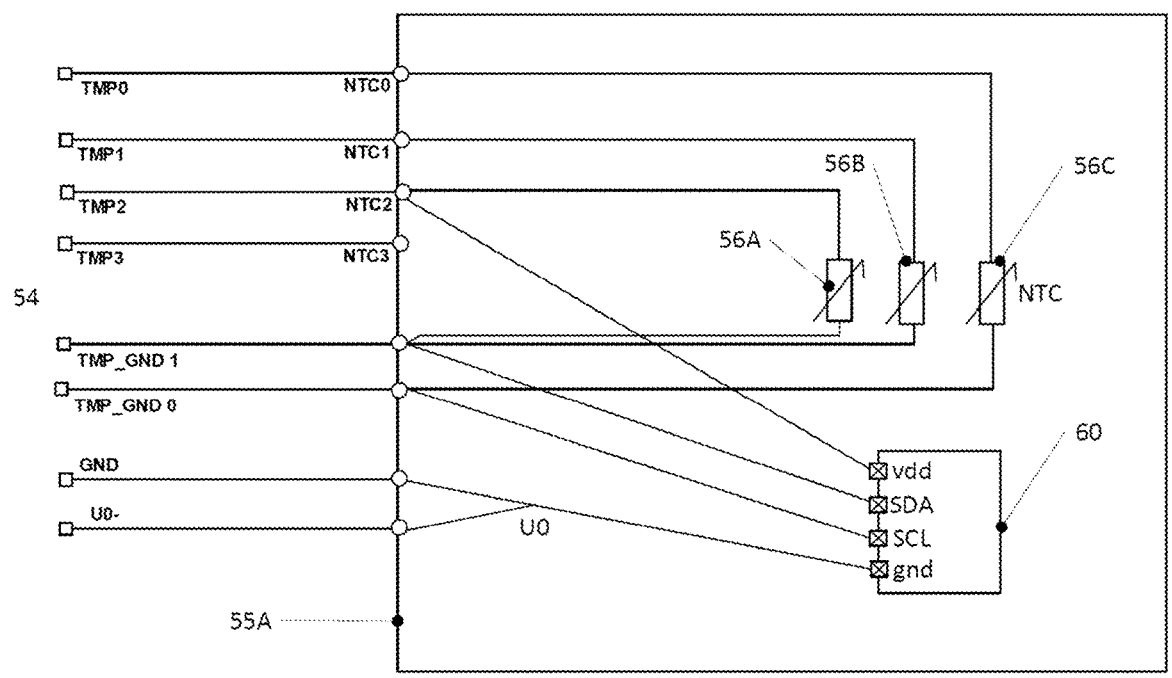
FIG. 6A to 6C show different configurations for communication in a monitoring device such as the monitoring device shown in FIG. 5.
Figure 6B:
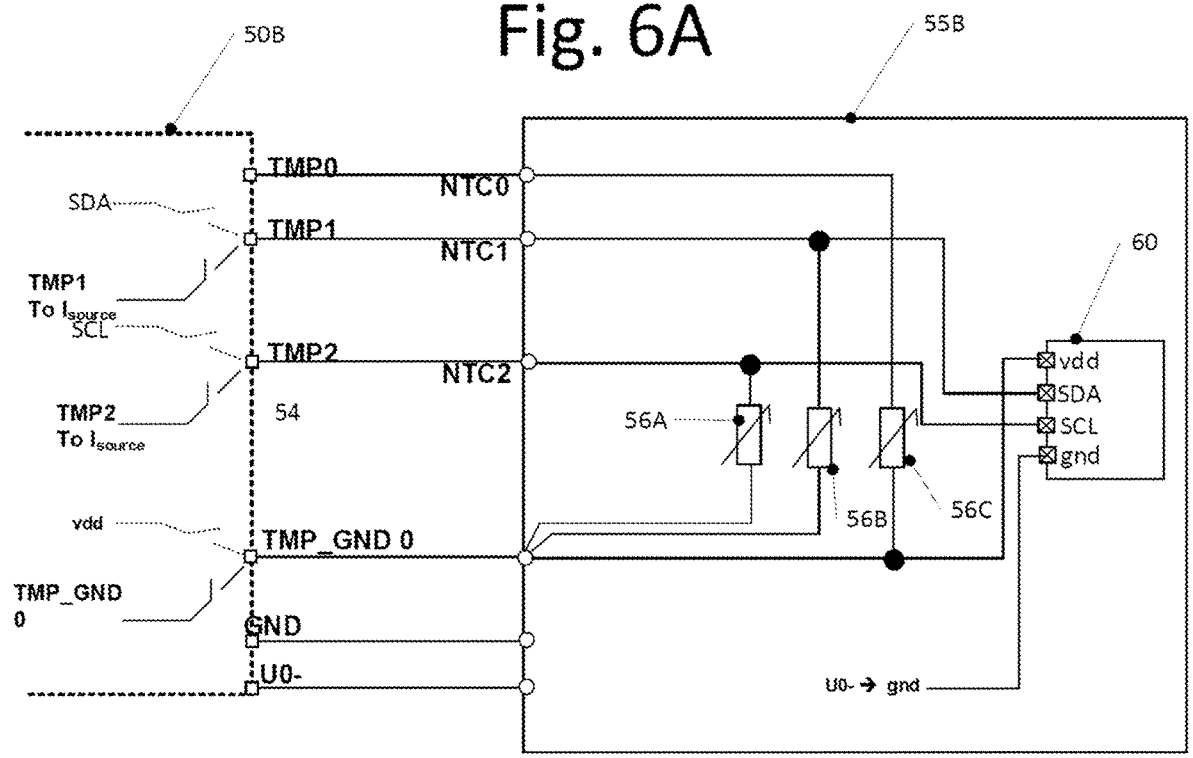
Figure 6C:
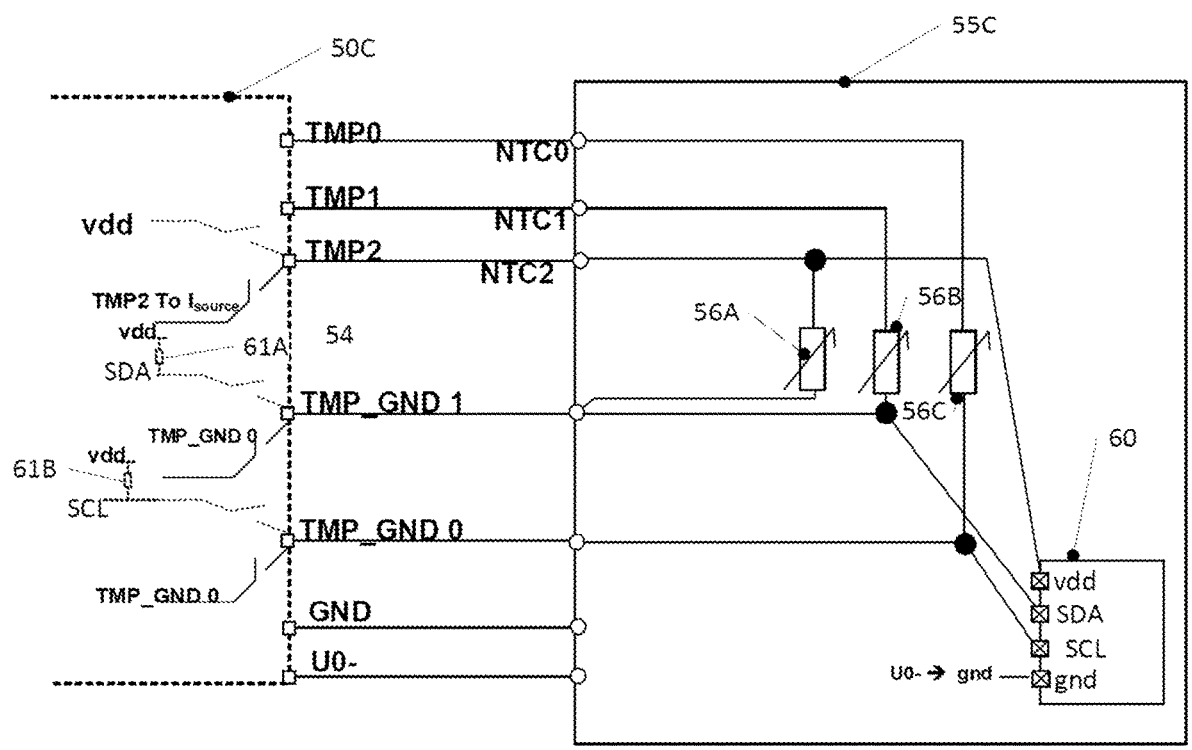

FIGS. 6A to 6C show different options for using the interface 54 shown in FIG. 5 in a first operating mode to communicate with a security device 60 and in a second operating mode to communicate with the temperature-dependent resistors 56A to 56C, i.e. to apply voltage to the resistors.

Figure 7:
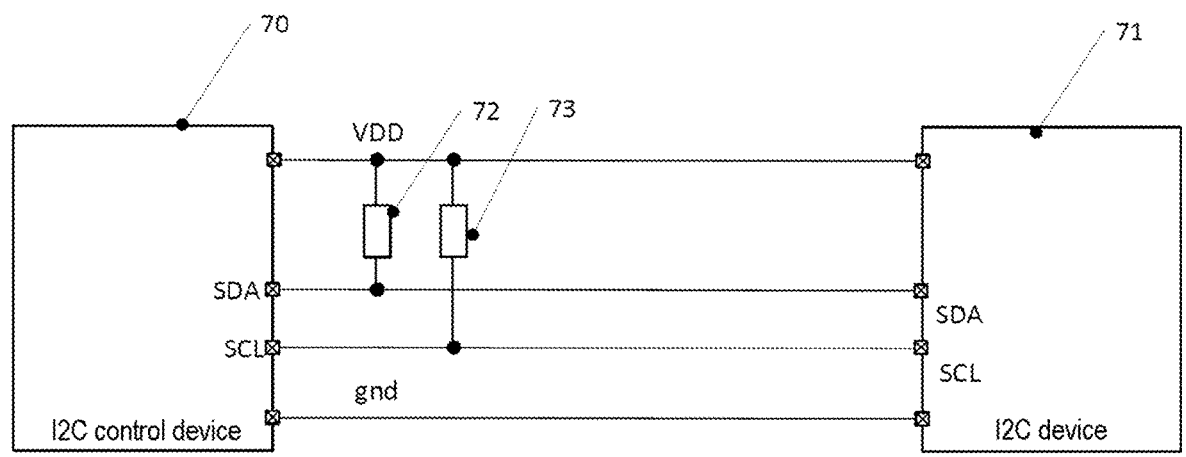
FIG. 7 is a diagram to illustrate an I2C interface.

FIG. 6A shows a first approach. A positive supply voltage (VDD) is fed here via a connection TMP2 or NTC2, which is used in the second operating mode for the temperature-dependent resistor 56A, to a security devices 60. One connection TMP_GND1 is used as a data line SDA and one connection TMP_GND0 is used as a clock line SCL. A ground connection GND of the interface 54 is used to connect the security device 60 to ground. In the example shown in FIG. 6A, the security device 60 is configured to communicate according to the I2C protocol. The basic structure of an I2C system is shown schematically in FIG. 7. In FIG. 7, an I2C control device 70 communicates with an I2C device 71. A line is provided for a positive supply voltage (VDD), a line for ground (GND), a data line (SDA) and a clock line (SCL). Pull-up resistors 72, 73 connect the data line or the clock line to VDD so that the lines SDA, SCL can be operated, for example, by drivers which draw the lines electively to ground (GND) against the pull-up resistors 72, 73.

In the case of the implementation as an I2C interface in the first operating mode, two of the temperature-dependent resistors 56A to 56C can be used in one alternative as pull-up resistors. This alternative is shown in FIG. 6B.

Within the schematically shown control device 50B which corresponds to the control device 50 shown in FIG. 5 apart from the details described below, a path for the first operating mode is indicated by a broken line and a path for the second operating mode is indicated by a continuous line, wherein said paths can be connected electively in each case with switches to the connections TMP 0, TMP 1, TMP 2 and TMP_GND 0. In the second operating mode, the connections TMP0, TMP1 and TMP2 serve as separate connections for the temperature-dependent resistors 56A, 56B and 56C, and the connection TMP_GND0 serves as a common ground connection for all three resistors 56A bis 56C.

In the first operating mode, the connection TMP_GND0 of the second interface is connected to a connection for the positive supply voltage vdd of the security device 60 and supplies the security device 60 with voltage. The security devices 60 is connected to ground via a U0– connection which corresponds to a local ground. As a result, in the event of a switchover to the second operating mode, the vdd connection of the security devices 60 is then applied to ground so that the security device 60 can be safely deactivated.

In the example shown, the data connection SDA of the security device 60 is connected to the connection TMP1 and the clock connection SCL is connected to the connection TMP2.

In this case, the resistors 56A and 56B serve as pull-up resistors for the clock line or data line, so that no separate pull-up resistors need to be provided. Typical values for the temperature-dependent resistors 56A to 56C lie between 100 kΩ and 200Ω. They can therefore be used as pull-up resistors. It should also be noted that, when a device starts up, the temperature is not yet particularly high, as a result of which the resistance values move within a smaller range than during normal operation when a possible temperature increase is intended to be measured.

Alternatively, pull-up resistors can also be provided in the monitoring device. FIG. 6C shows a corresponding example with a monitoring device 50C. Two separate ground connections TMP_GND0, TMP_GND1 are provided here for the resistors 56A to 56C, wherein the resistors 56A and 56B are connected to TMP_GND1 and the resistor 56C is connected to the connection TMP_GND0.

In this example, the vdd connection of the security device 60 is connected to the connection TMP2, the data connection SDA is connected to the connection TMP_GND1, the clock connection SCL is connected to the connection TMP_GND0, and the ground connection is in turn supplied via the connection U0–. In the monitoring device 50C, the broken lines in turn indicate signal paths for the first operating mode and the continuous lines indicate signal values for the second operating mode.

Pull-up resistors 61A and 61B are provided in this case within the monitoring device 50C for the clock line and data line in the case of the operation as an I2C interface.

As indicated in FIGS. 6A to 6C, different options therefore exist for connecting the security devices to the interface 54, and either temperature-dependent resistors which are used as temperature sensors in the second operating mode can be used as pull-up resistors, or separate pull-up resistors can be provided.

Figure 8:
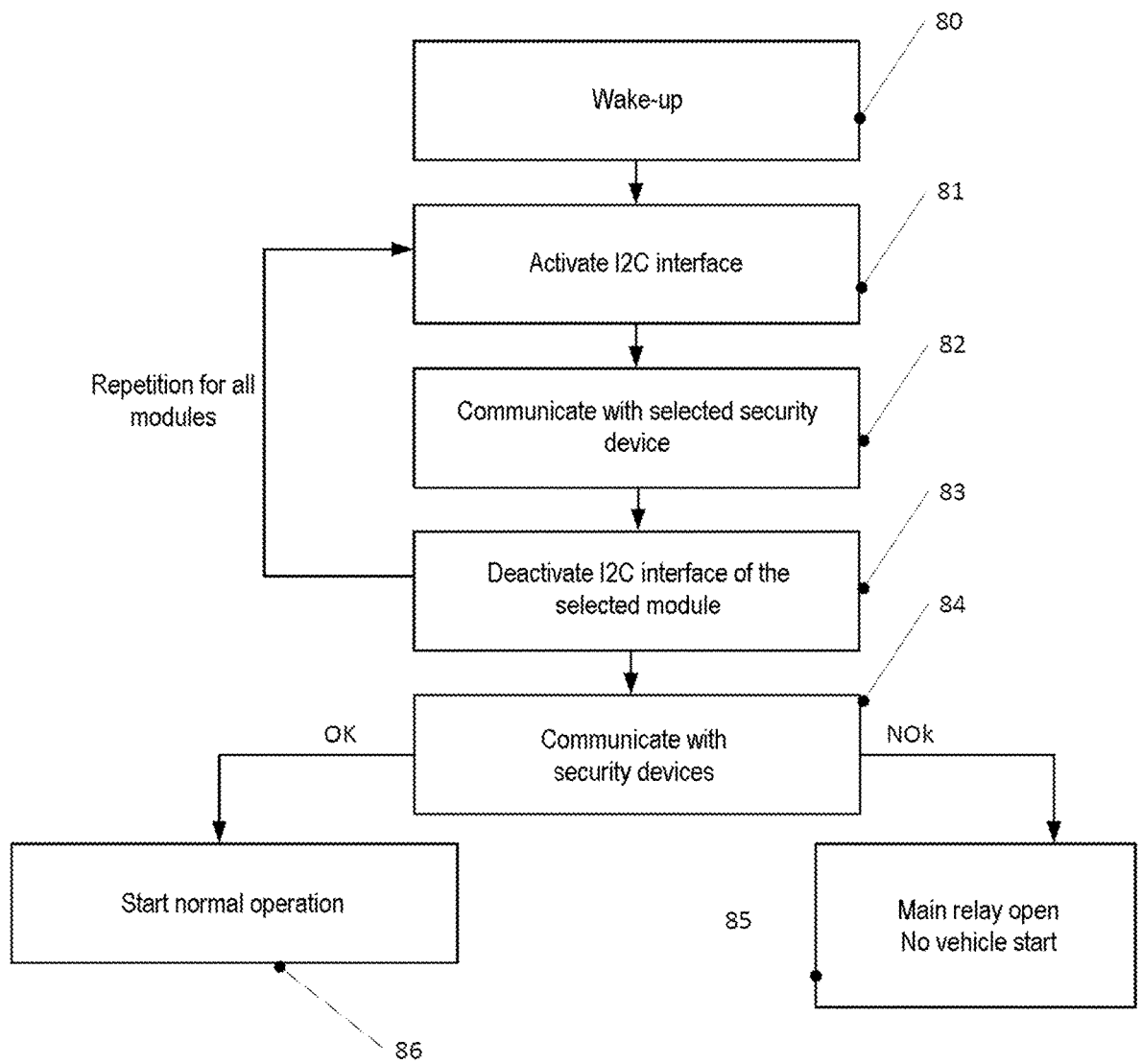
FIG. 8 is a flow diagram to illustrate a method according to a further example embodiment.

As already mentioned, all battery modules, for example all battery modules 32 from FIG. 3, can be interrogated during a wake-up of a device such as a vehicle which contains the battery system. FIG. 8 shows a flow diagram of a method of this type.

The system is woken up at 80. The procedures at 81 to 83 are then repeated for all modules. The I2C interface, i.e. the first operating mode, is successively activated at 81 and communication takes place at 82 with the selected security device, i.e. the security device of the module that has just been interrogated. Following the interrogation, the I2C interface is deactivated once more at 83, for example by switching the respective second operating interface of the monitoring device to the second operating mode.

A check is then carried out at 84 to determine whether the communication with the security devices at 82 was in order for all security devices, i.e. all battery modules were correctly authenticated. Tf so, the normal operation of the device is started at 86 and the use of the battery system is enabled. If at least one module was not correctly authenticated, a main relay, for example, which connects the battery modules to the rest of the vehicle remains open at 85, and no vehicle start or start of a different device which uses the battery system takes place.

In the case of FIG. 8 also, the procedures do not necessarily have to be performed in the order shown. The check to determine whether the communication with the security devices was in order (84) can, for example, be carried out for each security device immediately after the communication at 82, and, as soon as a communication reveals an incorrect authentication, the method can be ended, and no vehicle start takes place (corresponding to 85). In this case, the other modules then no longer need to be checked.

In the case of a daisy-chain-like connection as shown in FIG. 3, the repetitions can be carried out step-by-step along the chain, i.e. in the example shown in FIG. 3 first for the module 32A, then for the module 32B, etc. However, other sequences are also possible.

Some example embodiments are defined by the following examples:

Example 1. Monitoring device for a battery module, having:
- a first interface which is configured to communicate with a control device, and
- a second interface which is configured to communicate as a digital interface with a security device of a battery module in a first operating mode, and to communicate with a temperature sensor in a second operating mode, wherein the first operating mode and the second operating mode at least partially use the same connections of the second interface.

Example 2. Monitoring device according to example 1, wherein the digital interface is an I2C interface.

Example 3. Monitoring device according to example 1 or 2, wherein the second interface is configured to be connected to a group of temperature-dependent resistors as the temperature sensor and to use at least one resistor from the group of temperature-dependent resistances as a pull-up resistor or pull-down resistor for the digital interface in the first operating mode.

Example 4. Monitoring device according to example 1 or 2, wherein the monitoring device has at least one pull-up or pull-down resistor for the digital interface.

Example 5. Monitoring device according to one of examples 1 to 4, wherein the monitoring device is configured to receive authentication information from the security device and output it via the first interface in the first operating mode, and to output temperature information via the first interface in the second operating mode.

Example 6. Monitoring device according to one of examples 1 to 5, wherein the second interface comprises a connection via which a positive supply voltage to supply the security device is output in the first operating mode, and a ground potential or a negative supply voltage is output in the second operating mode.

Example 7. Battery system, having:
- a group of battery modules, wherein each battery module has a security device,
- a group of monitoring devices according to one of examples 1 to 6, wherein a monitoring device from the group of monitoring devices is assigned to each battery module in the group of battery modules, and
- a control device which is connected to the respective first interfaces of the monitoring devices.

Example 8. Battery system according to example 7, wherein the control device is configured to set the monitoring devices to the first operating mode, to receive authentication information from the security devices of the battery modules via the monitoring devices, and to enable a normal operation of the battery system only if the authentication information correctly authenticates the security devices.

Example 9. Method for a battery system, comprising: communicating between a monitoring device and a control device via a first interface of the monitoring device, communicating between the monitoring device and a security device of a battery module via a second interface of the monitoring device in a first operating mode of the first interface as a digital interface, and
communicating between the monitoring device and a temperature sensor via the second interface in a second operating mode of the second interface, wherein the first operating mode and the second operating mode at least partially use the same connections of the second interface.

Example 10. Method according to example 9, further comprising:
querying authentication information of the security device by means of the control device via the monitoring device.

Example 11. Method according to example 10, wherein the method is carried out for a multiplicity of security devices of a multiplicity of battery modules and a multiplicity of monitoring devices, further comprising:
enabling a normal operation of a battery system comprising the multiplicity of battery modules only if the authentication information correctly authenticates the security devices.

Example 12. Method according to one of examples 9 to 11, wherein communicating via the second interface in the first operating mode comprises outputting a positive supply voltage to supply the security device via a connection of the second interface, and communicating via the second interface in the second operating mode comprises outputting a ground potential or a negative supply voltage via the connection of the second interface.

Example 13. Method according to one of examples 9 to 12, wherein the temperature sensor comprises a group of temperature-dependent resistors, wherein communicating via the second interface in the first operating mode comprises using at least one resistor from the group of temperature-dependent resistors as a pull-up resistor or pull-down resistor for the digital interface.

Although specific example embodiments have been illustrated and described in this description, persons with conventional technical knowledge will recognize that a multiplicity of alternative and/or equivalent implementations can be chosen as a substitution for the specific example embodiments which are shown and described in this description without departing the scope of the presented invention. This application is intended to cover all adaptations or variations of the specific example embodiments which are discussed here. It is therefore intended that this invention is limited only by the claims and the equivalents of the claims.

The invention claimed is:

1. A monitoring device for a battery module, the monitoring device comprising:
a first interface configured to communicate with a control device;
a second interface comprising at least a first connection and a second connection;
a first set of switches coupled to the first connection;
a second set of switches coupled to the second connection; and
circuitry, wherein the circuitry is configured to:
when in a first operating mode, communicate as a digital interface with a security device of the battery module, wherein to communicate as the digital interface, the circuitry is configured to switch the first set of switches to provide a positive supply voltage to the first connection and to switch the second set of switches to provide a clock line or a data line to the second connection; and
when in a second operating mode, communicate with a temperature sensor, wherein to communicate with the temperature sensor, the circuitry is configured to switch the first set of switches to provide a ground potential or a negative supply to the first connection, measure a voltage between the first connection and the second connection, and determine a temperature measurement based on the voltage between the first connection and the second connection.

2. The monitoring device according to claim 1, wherein when in the first operating mode, the second interface is configured to operate as an I2C interface.

3. The monitoring device according to claim 1, wherein the second interface is configured to be connected to a group of temperature-dependent resistors as the temperature sensor and to use at least one resistor from the group of temperature-dependent resistances in the first operating mode as a pull-up resistor or a pull-down resistor for the digital interface in the first operating mode.

4. The monitoring device according to claim 1, wherein the monitoring device includes at least one pull-up or pull-down resistor for the digital interface.

5. The monitoring device according to claim 1, wherein the monitoring device is configured to receive authentication information from the security device and output the authentication information via the first interface in the first operating mode, and to output temperature information via the first interface in the second operating mode.

6. A battery system comprising:
- a group of battery modules, wherein each battery module has a security device;
- a group of monitoring devices, wherein each of the monitoring devices comprises a first interface configured to communicate with a control device a second interface comprising at least a first connection and a second connection, a first set of switches coupled to the first connection, a second set of switches coupled to the second connection, and circuitry, wherein the circuitry is configured to:
    - when in a first operating mode, communicate as a digital interface with a corresponding security device of a respective battery module, wherein to communicate as the digital interface, the circuitry is configured to switch the first set of switches to provide a positive supply voltage to the first connection and to switch the second set of switches to provide a clock line or a data line to the second connection; and
    - when in a second operating mode, communicate with a temperature sensor, wherein to communicate with the temperature sensor, the circuitry is configured to switch the first set of switches to provide a ground potential or a negative supply to the first connection, measure a voltage between the first connection and the second connection, and determine a temperature measurement based on the voltage between the first connection and the second connection,
- wherein a monitoring device from the group of monitoring devices is assigned to each battery module in the group of battery modules; and
- a control device which is connected to the respective first interfaces of the monitoring devices.

7. The battery system according to claim 6, wherein the control device is configured to set the monitoring devices to the first operating mode, to receive authentication information from the security devices of the battery modules via the monitoring devices, and to enable a normal operation of the battery system only if the authentication information correctly authenticates the security devices.

8. A method for a battery system, the method comprising:
- communicating between a monitoring device and a control device via a first interface of the monitoring device;
- communicating between the monitoring device and a security device of a battery module via a second interface of the monitoring device in a first operating mode of the first interface as a digital interface, wherein the second interface comprises a first connection and a second connection and wherein communication in the first operating mode comprises switching a first set of switches to provide a positive supply voltage to the first connection and switching a second set of switches to provide a clock line or a data line to the second connection; and
- communicating between the monitoring device and a temperature sensor via the second interface in a second operating mode of the second interface, wherein communication in the second operating mode comprises switching a first set of switches to provide a ground potential or a negative supply to the first connection, measuring a voltage between the first connection and the second connection, and determining a temperature measurement based on the voltage between the first connection and the second connection.

9. The method according to claim 8, further comprising:
querying authentication information of the security device by means of the control device via the monitoring device.

10. The method according to claim 9, wherein the method is carried out for a multiplicity of security devices of a multiplicity of battery modules and a multiplicity of monitoring devices, the method further comprising:
enabling a normal operation of a battery system comprising the multiplicity of battery modules in response to the authentication information correctly authenticating the security devices.

11. The method according to claim 8, wherein the temperature sensor comprises a group of temperature-dependent resistors, wherein communicating via the second interface in the first operating mode comprises using at least one resistor from the group of temperature-dependent resistors as a pull-up resistor or a pull-down resistor for the digital interface.

* * * * *